United States Patent
Morin et al.

(10) Patent No.: US 7,528,030 B2
(45) Date of Patent: May 5, 2009

(54) SEMICONDUCTOR DEVICE COMPRISING AT LEAST ONE MOS TRANSISTOR HAVING AN ETCH STOP LAYER, AND CORRESPONDING FABRICATION PROCESS

(75) Inventors: Pierre Morin, Grenoble (FR); Catherine Chaton, Theys (FR)

(73) Assignees: STMicroelectronics (Crolles 2) SAS, Crolles Cedex (FR); Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 11/517,801

(22) Filed: Sep. 8, 2006

(65) Prior Publication Data

US 2007/0069256 A1 Mar. 29, 2007

(30) Foreign Application Priority Data

Sep. 14, 2005 (FR) .................................. 05 09392

(51) Int. Cl.
*H01L 21/8234* (2006.01)
(52) U.S. Cl. ...................... 438/199; 438/217; 438/230; 438/231; 257/E21.632
(58) Field of Classification Search ......... 438/199–234; 257/E21.632
See application file for complete search history.

(56) References Cited

U.S. PATENT DOCUMENTS

| | | | |
|---|---|---|---|
| 2003/0181005 A1 | 9/2003 | Hachimine et al. | |
| 2005/0045888 A1* | 3/2005 | Kadowaki et al. | 257/69 |
| 2005/0194596 A1* | 9/2005 | Chan et al. | 257/66 |
| 2006/0094135 A1* | 5/2006 | Lin et al. | 438/14 |
| 2006/0246672 A1* | 11/2006 | Chen et al. | 438/301 |
| 2006/0286758 A1* | 12/2006 | Liang et al. | 438/305 |

OTHER PUBLICATIONS

Shimizu, et al., "Local Mechanical-Stress Control (LMC): A New Technique for CMOS-Performance Enhancement," Institute of Electrical and Electronics Engineers, International Electron Devices Meeting 2001, IEDM Technical Digest, Washington, DC, Dec. 2-5, 2001, New York, NY; IEEE, US Dec. 2, 2001, pp. 1941-1944; XP010575160: ISBN: 0-7803-7050-3.

Boeuf, et al., "A Conventional 45mm CMOS node Low-Cost Platform for General Purpose and Low Power Applications," Electron Devices Meeting, 2004; IEDM Technical Digest, IEEE International San Francisco, CA, US, Dec. 13-15, 2004, Piscataway, NJ, US, IEEE, Dec. 13, 2004, pp. 425-428; XP010788806, ISBN: 0-7803-8684-1.

Ito, et al., "Effect of mechanical stress induced by etch-stop nitride: impact on deep-submicron transistor performance," Microelectronics and Reliability, Elsevier Science Ltd., GB, vol. 42, No. 2, Feb. 2002, pp. 201-209; XP002332483, ISSN: 0026-2714.

Preliminary French Search Report, FR 05 09392, dated Jun. 7, 2006.

* cited by examiner

*Primary Examiner*—H. Jey Tsai
(74) *Attorney, Agent, or Firm*—Gardere Wynne Sewell LLP

(57) ABSTRACT

A semiconductor device includes at least one MOS transistor, each transistor being provided with a source region and a drain region formed in a semiconductor substrate, along with a gate region and spacers. The transistor is covered with a unitary etch stop layer that includes at least a first zone having a first residual stress level (in tension) covering at least one part of the transistor and at least a second zone having a second residual stress level (in compression) covering at least another part of the device. With this configuration, the first residual stress level is higher than the second residual stress level.

8 Claims, 3 Drawing Sheets

SEMICONDUCTOR DEVICE COMPRISING AT LEAST ONE MOS TRANSISTOR HAVING AN ETCH STOP LAYER, AND CORRESPONDING FABRICATION PROCESS

PRIORITY CLAIM

The present application claims priority from French Application for Patent No. 05 09392 filed Sep. 14, 2005, the disclosure of which is hereby incorporated by reference.

BACKGROUND OF THE INVENTION

1. Technical Field of the Invention

The present invention relates to integrated circuits and more particularly to semiconductor devices comprising at least one transistor, preferably an MOS transistor, of improved electrical performance.

2. Description of Related Art

Conventionally, MOS transistors are formed in an active zone of a semiconductor substrate isolated from the rest of the substrate by an isolation region, for example a region of the STI (Shallow Trench Isolation) type, by the formation of source and drain regions, which define a channel between them, and of a gate region that extends above this channel.

MOS transistors are generally covered with an etch stop layer, for example an edge-free nitride layer that may be formed following a PECVD (Plasma Enhanced Chemical Vapor Deposition) operation. This etch stop layer is then covered with a dielectric layer in which contact holes are etched so as to electrically connect the source, drain and gate regions of the transistor.

The etch stop layer may therefore represent a detection point during the operation of etching the contact holes in the dielectric layer. More particularly, detection of this layer allows the etching of the contact holes to be continued in order to reach the silicon zones of the transistor, for example for a predetermined time.

The residual stress of the etch stop layer allows the electrical performance of a transistor, in particular the current that flows between the drain and the source in the "on" state, to be modified. This current may be increased or decreased according to the mechanical stress level applied to the transistor. This is because the stop layer makes it possible to induce a local curvature in the substrate of the semiconductor device, which generates a mechanical stress in the channel. Such a stress acts on the mobility of the carriers and consequently on the electrical performance of the transistor.

In particular, it is found that an etch stop layer inducing compression improves the operation of a pMOS-type transistor but at the same time degrades the operation of an nMOS-type transistor. Conversely, an etch stop layer that induces tension improves the operation of an nMOS-type transistor, but degrades the operation of a pMOS-type transistor. Thus, any improvement made to one type of transistor is made to the detriment of the other type of transistor.

To improve the electrical performance of nMOS and pMOS transistors at the same time, a process has already been proposed in document IBM IEDM 2004 which consists in producing a semiconductor device based on MOS transistors, in which a first etch stop layer in tension covers at least one nMOS transistor and a second etch stop layer in compression covers at least one pMOS transistor.

Such a process consists in depositing a first etch stop layer in tension over all of the transistors of the device and then in carrying out photolithography and etching steps so as to remove the parts of the stop layer that cover the pMOS transistors. This process then involves the deposition of a second etch stop layer in compression over all of the transistors and photolithography and etching steps being carried out on the parts of the stop layer covering the nMOS transistors.

This process thus has the drawback of involving etching steps that are difficult to implement and may damage the transistors of the device.

FR 2 846 789 discloses a semiconductor device based on MOS transistors, in which the etch stop layer includes a first layer of material having a first residual stress level covering some of the transistors of the device, for example a pMOS transistor, and a second layer of material that has a second residual stress level covering all of the transistors of the device, namely both pMOS transistors and nMOS transistors.

In this particular structure, the first layer and the second layer of the material of the etch stop layer are chosen so as to have residual stress levels that are of opposite sign so as to obtain simultaneous improvement in the electrical performance on both types of transistor.

Thus, in this structure, a pMOS transistor may be covered both with a first layer of material in compression and with a second layer of material in tension, the superposition of these two layers inducing compression in the channel of this transistor, improving the mobility of the carriers, whereas only the second layer of material inducing tension covers the nMOS transistor.

However, this process has inter alia the drawback of involving a photolithography step followed by at least one etching step which are difficult to implement.

In particular, this process involves a step of etching the first layer of material deposited, for example, on an nMOS transistor, which is difficult to implement as this step may damage the transistor.

Furthermore, the thickness of the layers is not uniform above the various types of transistor, which may result in difficulties in etching the contact holes in order for the silicon zones of the transistor to be electrically connected.

In view of the foregoing, the object of the invention is in particular to produce a semiconductor device comprising at least one MOS transistor, in which it is possible for the residual stress level of an etch stop layer to be adapted in a discriminating manner according to the nature of the transistors that it covers, while minimizing the number of photolithography and etching steps.

SUMMARY OF THE INVENTION

Thus, according to an embodiment, what is proposed is a semiconductor device comprising at least one MOS transistor provided with source regions and drain regions formed in a semiconductor substrate, with a gate region and with spacers. The transistor is covered by an etch stop layer that includes at least a first zone having a first residual stress level, which covers at least one part of said transistor, and at least a second zone having a second residual stress level, which covers at least another part of the device, said first zone having a first residual stress level higher than the second residual stress level of said second zone.

A semiconductor device is obtained in which the etch stop layer uniformly deposited over all of the transistors has a residual stress level that is adapted according to each type of transistor that it covers. In particular, each of the MOS transistors constituting the device may obtain improvement in current gain that may be greater than 10%.

The etch stop layer makes it possible to induce a mechanical stress, either a compressive stress or a tensile stress, in the channel of a transistor.

Thus, a device is obtained in which one and the same etch stop layer may have zones that do not induce the same mechanical stress according to the type of transistor covered.

An etch stop layer is also obtained which has a uniform thickness, thereby making it easier to etch through the dielectric layer of the contact holes.

The etch stop layer may be a dielectric layer.

According to an embodiment, said second zone of the etch stop layer covers at least part of at least one other transistor.

Preferably, the MOS transistors of the semiconductor device comprise nMOS-type transistors and pMOS-type transistors and the first zone of the etch stop layer covers at least one part of at least one nMOS transistor and the second zone of the etch stop layer covers at least one part of at least one pMOS transistor.

For example, the etch stop layer includes a zone in tension covering the nMOS transistors and a zone in compression covering the pMOS transistors.

Preferably, the etch stop layer is a silicon nitride layer.

In another advantageous embodiment, the etch stop layer includes an upper part above the gate region a lower part above the source regions and drain regions, and a lateral part above the spacers, the lower part of said second zone has a residual stress level higher than the upper and lateral parts of said second zone of the etch stop layer.

In another embodiment, the device may comprise two superposed etch stop layers, one on top of the other, each having a zone in compression covering a pMOS transistor and a zone in tension covering an nMOS transistor. Thus, in this structure, a pMOS transistor may be covered by two zones in compression and an nMOS transistor may be covered by two zones in tension using two stop layers, one superposed on the other.

According to another aspect of the invention, what is proposed is also a process for fabricating a semiconductor device having MOS transistors, which comprises the formation of transistors in a semiconductor substrate and the formation of an etch stop layer on all of the transistors, in which the residual stress level of the etch stop layer is modified so as to obtain an etch stop layer that includes at least a first zone having a first residual stress level, which covers at least one part of at least one transistor, and at least a second zone having a second residual stress level, which covers at least another part of the device, said first zone having a first residual stress level higher than the second residual stress level of said second zone.

The process makes it possible to produce an etch stop layer whose residual stress level is adapted according to the type of transistor covered. Such a process also makes it possible to minimize the number of photolithography and etching steps, which are difficult to implement.

Preferably, the step of modifying the residual stress level of the etch stop layer includes a step of depositing a mask above the etch stop layer, covering at least one part of at least one transistor, an irradiation and heat treatment step, and the removal of said mask.

As a variant, the step of modifying the residual stress level of the etch stop layer includes a step of depositing a mask above the etch stop layer, covering at least one part of at least one transistor, an electron bombardment step on all of the transistors, and the removal of said mask.

Preferably, the step of modifying the residual stress level of the etch stop layer includes a step of depositing a mask on the etch stop layer covering at least part of at least one pMOS transistor.

In one method of implementation, the step of modifying the residual stress level of the etch stop layer includes a step of depositing a mask on the etch stop layer that covers the gate regions and the spacers of a pMOS transistor.

In another embodiment, a semiconductor device comprises a pMOS transistor having a source region and a drain region formed in a semiconductor substrate, and having a gate region and spacers. A unitary etch stop layer covers the pMOS transistor, wherein the unitary etch stop layer includes a first zone having a first residual stress level which covers the source and drain regions, and a second zone having a second residual stress level which covers the gate region and spacers, said first zone having a first residual stress level higher than the second residual stress level of said second zone.

In another embodiment, a semiconductor device comprises an nMOS transistor having a source region and a drain region formed in a semiconductor substrate, and having a gate region and spacers and a pMOS transistor having a source region and a drain region formed in a semiconductor substrate, and having a gate region and spacers. A unitary etch stop layer covers the nMOS and pMOS transistors, wherein the unitary etch stop layer includes a first zone having a first residual stress level which covers the nMOS transistor, and a second zone having a second residual stress level which covers at least a portion of the pMOS transistor, said first zone having a first residual stress level higher than the second residual stress level of said second zone.

In yet another embodiment, a process for fabricating a pMOS semiconductor transistor comprises forming the pMOS transistor source, drain, gate and spacers and depositing a unitary etch stop layer over the pMOS transistor, the etch stop layer being in compression stress. The gate and spacers of the pMOS transistor are then masked and the stress of the unitary etch stop layer over the non-masked source and drain of the pMOS transistor is changed to be in tension.

In yet another embodiment, a process for fabricating a semiconductor device comprises forming an nMOS transistor source, drain, gate and spacers, forming a pMOS transistor source, drain, gate and spacers, and depositing a unitary etch stop layer over the nMOS and pMOS transistors, the etch stop layer being in compression stress. At least a portion of the pMOS transistor is masked so as to expose the nMOS transistor, and the stress of the unitary etch stop layer over the non-masked nMOS transistor is changed to be in tension.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

Figure 1:
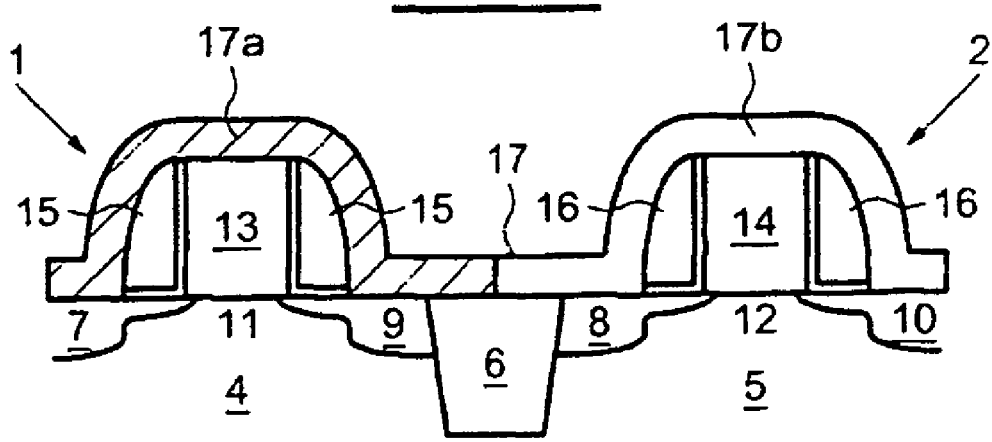
FIG. 1 shows a sectional view of the semiconductor device obtained according to one embodiment.

FIG. 1 shows a semiconductor device obtained according to one embodiment. In particular, this illustrates part of the semiconductor device in which two MOS transistors and an etch stop layer covering them have been formed.

As may be seen in this figure, the semiconductor device comprises two transistors 1 and 2, which are each produced in an active zone 4 and 5 of a semiconductor substrate, said zone being bounded by an STI isolating region 6. The transistors 1 and 2 have been produced by the formation of source regions 7 and 8 and drain regions 9 and 10, thus defining channel regions 11 and 12, respectively. The transistors 1 and 2 include a gate region 13 and 14 and spacers 15 and 16 respectively, so that the gate region 13 or 14 of the transistor 1 or 2 extends above the channel 11 or 12. The transistors 1 and 2 are covered with a unitary etch stop layer 17.

The unitary etch stop layer 17 may comprise a nitride layer, and preferably a silicon nitride layer.

In this figure, the etch stop layer 17 comprises a first zone 17a which has a first residual stress level $\sigma_1$ and covers the transistor 1 and a second zone 17b that has a second residual stress level $\sigma_2$ and covers the transistor 2.

Thanks to the embodiment of the stop layer 17 in the semiconductor device, the first zone 17a has a first residual stress level $\sigma_1$ higher than the second residual stress level $\sigma_2$ of the second zone 17b.

In the embodiment illustrated in this figure, the transistor 1, which is covered with the first zone 17a of the stop layer 17, is an nMOS transistor and the transistor 2 that is covered with the second zone 17b of the stop layer 17 is a pMOS transistor.

In particular, the first zone 17a covering the nMOS transistor 1 is in tension and the second zone 17b covering the pMOS transistor 2 is in compression.

For example, the first zone 17a has a residual stress level that may be equal to 1.8 GPa whereas the second zone 17b has a residual stress level that may be equal to −2 GPa.

Thus, a stop layer 17 capable of simultaneously modifying the operation of the nMOS and pMOS transistors, and in particular capable of improving the electrical performance of each of these transistors, is thus obtained.

Of course, the semiconductor device may include several MOS transistors. In this case the first zone 17a of the stop layer 17 having a first residual stress level $\sigma_1$ then covers one part of the transistors, for example nMOS transistors, and the second zone 17b having a second residual stress level then covers another part of the device, and more particularly other transistors of the device, for example pMOS transistors.

FIGS. 2 to 5 show the main steps of a method of implementation allowing a semiconductor device to be obtained in which the etch stop layer 17 makes it possible for the electrical performance of the transistors to be simultaneously improved.

Figure 2:
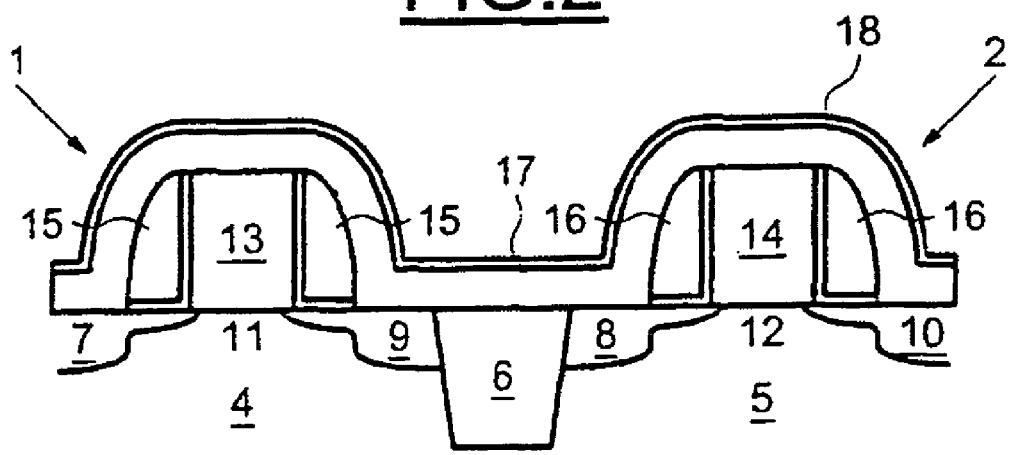
FIGS. 2 to 5 show the steps of a method of producing such a device.

As previously, FIG. 2 shows part of the semiconductor device comprising the transistors 1 and 2 that are described above. In the same way as previously, the transistor 1 is an nMOS transistor and the transistor 2 is a pMOS transistor.

In this figure, the etch stop layer 17 covering the entire surface of the semiconductor device may be obtained by PECVD (Plasma Enhanced Chemical Vapor Deposition). Conventionally, this deposition is carried out using a gas mixture comprising, for example, silane and ammonia.

After this deposition, the entire etch stop layer 17 is in compression. In this figure, the stop layer 17 therefore induces compression in the channel of the transistors 1 and 2. In particular, the stop layer has a residual stress of about −2 GPa.

Also as shown in this figure, a layer 18 is deposited over the entire surface of the semiconductor device thus covering the transistors 1 and 2 and also the isolating region 6. The layer 18 is a layer that is transparent to ultraviolet radiation. Preferably, the layer 18 is a dielectric layer.

Figure 3:
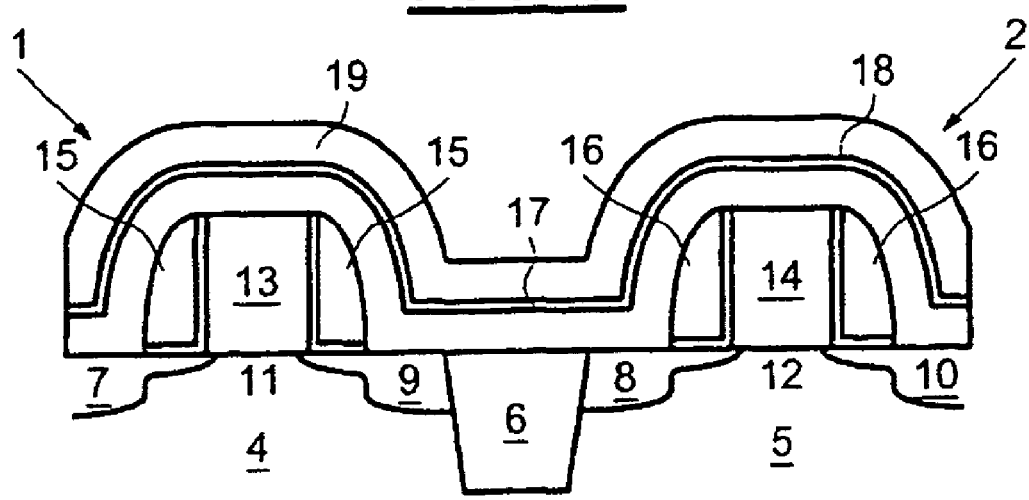

As may be seen in FIG. 3, a mask 19 is then deposited on the layer 18 so as to re-cover the entire semiconductor device. The mask 19 is a layer that absorbs ultraviolet radiation. The mask 19 may be formed by a single absorbent layer, possibly a dielectric layer, or by a multilayer stack, for example a polysilicon layer surmounted by an amorphous silicon layer.

The mask 19 may also be formed by an amorphous silicon layer surmounted by a metal layer.

Figure 4:
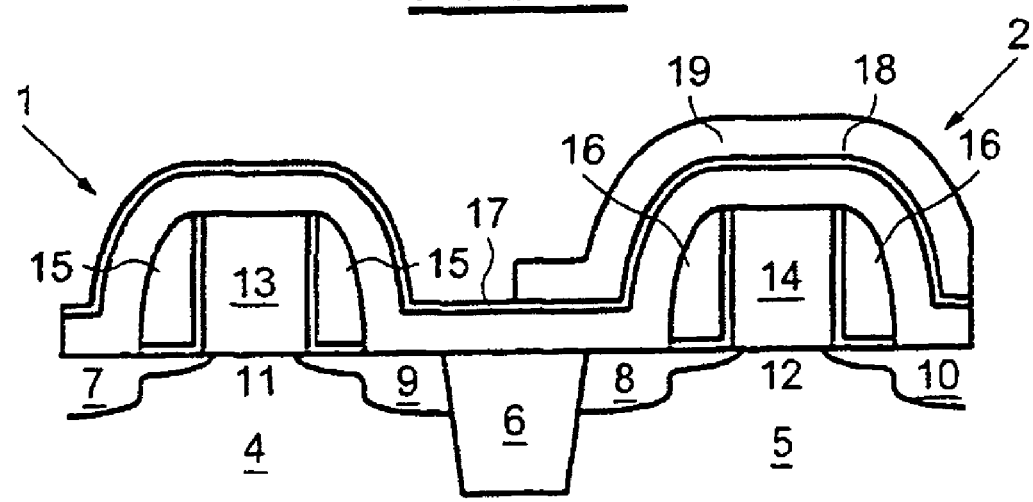

Next, a photolithography step is carried out on that part of the mask 19 covering the transistor 2, followed by a step of etching that part of the mask 19 covering the transistor 1, as illustrated in FIG. 4. This etching step is carried out down to the upper surface of the dielectric layer 18. Thus, after this etching step, the transistor 2 is still covered by part of the mask 19, whereas the upper surface of the layer 18 covering the transistor 1 is exposed. The layer 18 makes it possible in particular for the etching of that part of the mask 19 covering the transistor 1 to be selective, thereby preventing part of the stop layer 17 from being removed.

Figure 5:
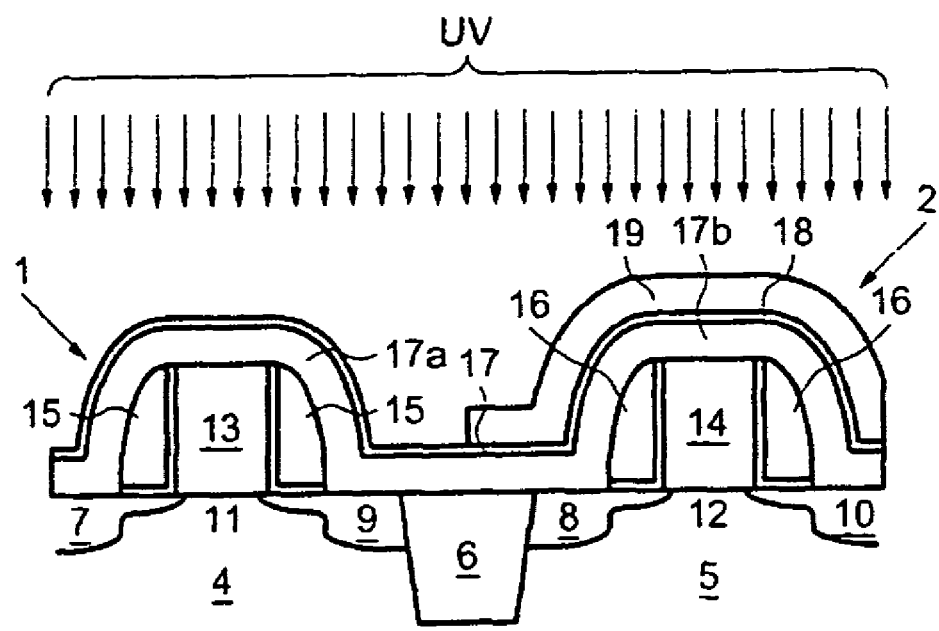

As illustrated in FIG. 5, a heat treatment, preferably at a temperature of 400° C., and an irradiation step are carried out on the entire device. This irradiation step consists in carrying out an ultraviolet radiation treatment. Preferably, this treatment may be carried out for a time of 5 mins.

A zone 17b of the stop layers 17 covering the transistor 2 and which is covered by part of the mask 19 is protected during the irradiation step. This is because that part of the mask 19 protecting the zone 17b absorbs the ultraviolet radiation.

On the other hand, a zone 17a of the stop layer 17 covering the transistor 1 which is covered by the layer 18, transparent to ultraviolet radiation, is not protected during this treatment.

Such a treatment modifies the residual stress level of the zone 17a of the stop layer 17 so as to make it switch from being in a compressive state to a tensile state.

Thus, after the layer 18 has been removed, a semiconductor device comprising two transistors 1 and 2 is obtained, which transistors are covered with an etch stop layer 17 that does not induce the same type of mechanical stress depending on the type of transistor, as illustrated in FIG. 1. In particular, the stop layer 17 does not induce a uniform mechanical stress according to the type of transistor.

Specifically, the stop layer 17 comprises a zone 17a in tension covering the transistor 1, which is an nMOS transistor, and a zone 17b in compression covering the transistor 2, which is a pMOS transistor. Thus, the zone 17a has a residual stress level that is higher than the residual stress level of the zone 17b.

This process therefore makes it possible for the performance of the nMOS transistors and the pMOS transistors to be simultaneously improved. In addition, this process does not involve an etching step that may damage the transistor 1 or 2.

Furthermore, the choice of the thickness and the nature of the material of the stop layer 17 makes it possible to obtain an amplitude of variation of the residual stress that may be large. In other words, the thickness and the nature of the material of the stop layer 17 make it possible to pass from a very low residual stress level $\sigma_1$ to a high residual stress level $\sigma_2$.

As a variant, instead of the heat treatment and the ultraviolet radiation treatment, it is also possible for an electron bombardment to be carried out on all of the transistors. In the same way as previously, the stop layer 17 has, after this step, a zone 17a having a first residual stress level $\sigma_1$ higher than the second residual stress level $\sigma_2$ of the zone 17b.

In the previous figures, the zones 17a and 17b of the stop layer 17 cover all of the transistors 1 and 2, that is to say the source regions 7 and 8, the drain regions 9 and 10, the gate regions 13 and 14 and the spacers 15 and 16.

However, the zones 17a or 17b may also cover part of the transistor 1 or 2. In particular, one part of the stop layer 17 covering the transistor 2, of pMOS type, may be in compression and another part of the stop layer 17 covering the transistor 2 may be in tension.

Figure 6:
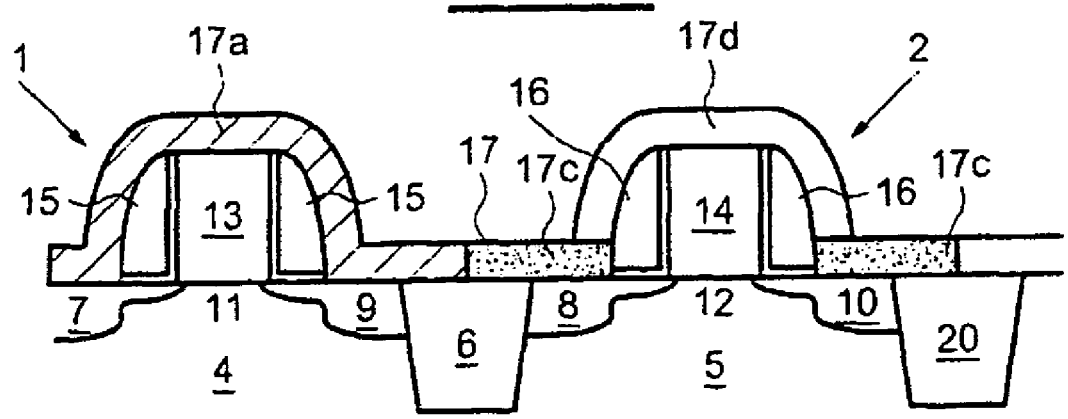
FIG. 6 shows a sectional view of a semiconductor device obtained according to another embodiment.

Referring now to FIG. 6, this shows a semiconductor device comprising two transistors 1 and 2, as described above, which are covered with an etch stop layer 17. In this figure, a second isolating region 20 has also been shown. In the same way as previously, the transistors 1 and 2 are nMOS transistors and pMOS transistors, respectively.

In this embodiment, the stop layer 17 comprises a zone 17a, which covers at the same time the gate region 13, the spacers 15 and the source region 7 and drain region 9 of the transistor 1, a zone 17c, which covers the source region 8 and drain region 10 of the transistor 2, and a zone 17d that covers the gate region 14 and the spacers 16 of the transistor 2.

In this figure, the zone 17c has a residual stress level that is higher than the residual stress level of the zone 17d that covers the gate region 14 and the spacers 16 of the transistor 2.

The zone 17c thus has the same residual stress level as the zone 17a covering the transistor 1.

In particular, the zones 17a and 17c are in tension whereas the zone 17d is in compression.

This variant may be obtained by applying the mask 19 only to the zone 17d of the transistor 2, that is to say above the upper and lateral parts of the stop layer 17 covering the gate region 14 and the spacers 16 of the transistor 2.

In this way, it is possible to improve the uniformity of the electrical performance of the various types of transistor.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A process for fabricating a semiconductor device, comprising:
    forming an nMOS transistor source, drain, gate and spacers;
    forming a pMOS transistor source, drain, gate and spacers;
    depositing a unitary etch stop layer over the nMOS and pMOS transistors, the etch stop layer being in compression stress;
    masking a gate and spacers of the pMOS transistor so as to expose the unitary etch stop layer over the nMOS transistor and source and drain of the pMOS transistor; and
    changing the stress of the exposed unitary etch stop layer over the non-masked nMOS transistor and non-masked source and drain of the pMOS transistor to be in tension.

2. The process of claim 1 wherein changing the stress comprises irradiating and heat treating of non-masked portions of the unitary etch stop layer.

3. The process of claim 1 wherein changing the stress comprises electron bombarding of non-masked portions of the unitary etch stop layer.

4. A process for fabricating a semiconductor device, comprising:
    forming an nMOS transistor source, drain, gate and spacers;
    forming a pMOS transistor source, drain, gate and spacers;
    depositing a unitary etch stop layer over the nMOS and pMOS transistors, the etch stop layer being in a first stress configuration;
    selectively masking the semiconductor device so as to produce a masked portion of the unitary etch stop layer and an exposed portion of the unitary etch stop layer; and
    changing the stress of the exposed unitary etch stop layer to be in a second stress configuration so that a stress of the unitary etch stop layer over all of the nMOS transistor and over the source and drain of the pMOS transistor is different from a stress of the unitary etch stop layer over the gate and spacers of the pMOS transistor.

5. The process of claim 4 wherein the first stress configuration is compression and the second stress configuration is tension.

6. The process of claim 5 wherein selectively masking comprises masking the gate and spacers of the pMOS transistor so that the exposed unitary etch stop layer overlies the nMOS transistor and source and drain of the pMOS transistor.

7. The process of claim 4 wherein changing the stress comprises irradiating and heat treating of the exposed portion of the unitary etch stop layer.

8. The process of claim 4 wherein changing the stress comprises electron bombarding of the exposed portion of the unitary etch stop layer.

* * * * *